United States Patent
Dustert et al.

(10) Patent No.: US 11,932,123 B2
(45) Date of Patent: Mar. 19, 2024

(54) ACTIVE DISCHARGE OF AN ELECTRIC DRIVE SYSTEM

(71) Applicant: Power Integrations, Inc., San Jose, CA (US)

(72) Inventors: Christoph Dustert, Soest (DE); Andreas Volke, Soest (DE); Klaus Harmann, Duesseldorf (DE)

(73) Assignee: POWER INTEGRATIONS, INC., San Jose, CA (US)

( * ) Notice: Subject to any disclaimer, the term of this patent is extended or adjusted under 35 U.S.C. 154(b) by 0 days.

(21) Appl. No.: 17/944,537

(22) Filed: Sep. 14, 2022

(65) Prior Publication Data
US 2023/0158896 A1    May 25, 2023

(30) Foreign Application Priority Data
Nov. 24, 2021   (EP) .................................. 21210185

(51) Int. Cl.
*H02J 7/00*   (2006.01)
*B60L 50/51*  (2019.01)
*B60L 50/60*  (2019.01)

(52) U.S. Cl.
CPC ............... B60L 50/60 (2019.02); B60L 50/51 (2019.02); *B60L 2210/10* (2013.01); *B60L 2210/40* (2013.01)

(58) Field of Classification Search
CPC ...... B60L 50/60; B60L 50/51; B60L 2210/40; B60L 2210/10
See application file for complete search history.

(56) References Cited

U.S. PATENT DOCUMENTS

| 6,456,475 B1 | 9/2002 | Balakrishnan et al. |
| 6,580,593 B2 | 6/2003 | Balakrishnan |
| 6,774,417 B1 | 8/2004 | Lin et al. |

(Continued)

FOREIGN PATENT DOCUMENTS

| CN | 110071572 A | 7/2019 |
| DE | 102012007324 A1 | 10/2013 |

(Continued)

OTHER PUBLICATIONS

European Application Serial No. 21210185.1, Extended European Search Report dated May 9, 2022, 11 pages.

*Primary Examiner* — Jared Fureman
*Assistant Examiner* — Esayas G Yeshaw
(74) *Attorney, Agent, or Firm* — Karina Martha G. Li; POWER INTEGRATIONS, INC.

(57) ABSTRACT

Discharge systems for electric vehicles and electric vehicles having discharge systems. In one implementation, a discharge system for an electric vehicle includes a step-down power converter configured to step down an input voltage to an output voltage; discharge circuitry coupled to the output of the step-down power converter, wherein the discharge circuitry is reversibly driveable to load the step-down power converter; an input component configured to receive input that originated from a human user or a sensor of the electric vehicle, wherein the input indicates that the electric vehicle is to shutdown; and discharge drive circuitry configured to drive the discharge circuitry to load the step-down power converter in response to the indication that the electric vehicle is to shutdown.

21 Claims, 5 Drawing Sheets

(56) References Cited

U.S. PATENT DOCUMENTS

| | | | |
|---|---|---|---|
| 7,760,524 | B2 | 7/2010 | Matthews |
| 7,995,360 | B2 | 8/2011 | Mayell |
| 8,063,622 | B2 | 11/2011 | Kung et al. |
| 8,115,457 | B2 | 2/2012 | Balakrishnan et al. |
| 8,279,636 | B2 | 10/2012 | Mayell |
| 8,928,235 | B2 | 1/2015 | Angeles |
| 9,219,420 | B1 | 12/2015 | Zhang et al. |
| 9,455,621 | B2 | 9/2016 | Lund et al. |
| 9,602,009 | B1 | 3/2017 | Baurle |
| 10,033,284 | B2 | 7/2018 | Werner et al. |
| 10,141,765 | B2 | 11/2018 | Balakrishnan et al. |
| 10,848,073 | B2 * | 11/2020 | Shikagawa ............ H02M 1/32 |
| 11,418,121 | B2 | 8/2022 | Odell et al. |
| 2016/0301233 | A1 * | 10/2016 | Takeuchi ................ B60L 53/14 |
| 2019/0074699 | A1 * | 3/2019 | Yano ...................... H02J 1/102 |
| 2019/0187211 | A1 * | 6/2019 | Müller ................... H02J 7/345 |
| 2020/0044577 | A1 * | 2/2020 | Shikagawa ............ H02P 27/06 |
| 2020/0122582 | A1 | 4/2020 | Curuvija et al. |
| 2021/0188100 | A1 * | 6/2021 | Yoshida ................. B60L 50/13 |
| 2022/0258610 | A1 | 8/2022 | Volke et al. |
| 2022/0263404 | A1 | 8/2022 | Volke et al. |
| 2023/0084872 | A1 * | 3/2023 | Beig ...................... B60L 50/70 |

FOREIGN PATENT DOCUMENTS

| | | | |
|---|---|---|---|
| EP | 2892144 | A2 | 7/2015 |
| EP | 3342624 | A1 | 7/2018 |
| EP | 3561982 | A1 | 10/2019 |
| WO | 2015082193 | A2 | 6/2015 |

* cited by examiner

ACTIVE DISCHARGE OF AN ELECTRIC DRIVE SYSTEM

CROSS-REFERENCE TO RELATED APPLICATIONS

This application claims priority to European Patent Application No. EP21210185.1, filed on Nov. 24, 2021, currently pending. European Patent Application No. EP21210185.1 is hereby incorporated by reference in its entirety.

TECHNICAL FIELD

This invention relates to the active discharge of an electric drive system.

BACKGROUND

Electric drive systems are found in electric vehicles such as, e.g., electric cars and trucks, hybrid electric cars and trucks, and electric trains and trams. Electric vehicles generally include an inverter that converts a battery or other dc output into an ac signal for driving an electric motor. In these vehicles, an energy storage capacitance is commonly used as an intermediate buffer between the battery and the inverter. These capacitances can be referred to as "DC link capacitors". These capacitances provide low-inductive current paths to the inverter output stage, and to store energy.

An electric drive system in a battery-powered electric vehicle will typically be shut down several thousand times over its operational lifespan. During a shutdown, the battery is isolated from the rest of the electric drive system. However, without further measures, the intermediate DC link capacitor will retain a charge after being disconnected from the battery. For safety reasons, regulatory agencies often require that this charge be dissipated reasonably soon after shutdown. Vehicle manufacturers may also have discharge requirements. For example, a typical requirement would have the DC link capacitor discharged within 2 seconds to a voltage below 60 volts.

In some cases, a discharge switch and a resistor can be coupled across the DC link capacitor. After disconnection from the battery, this discharge switch is switched into conduction and the DC link capacitor is discharged through the resistor.

DESCRIPTION OF DRAWINGS

Like reference symbols in the various drawings indicate like elements.

DETAILED DESCRIPTION

Figure 1:
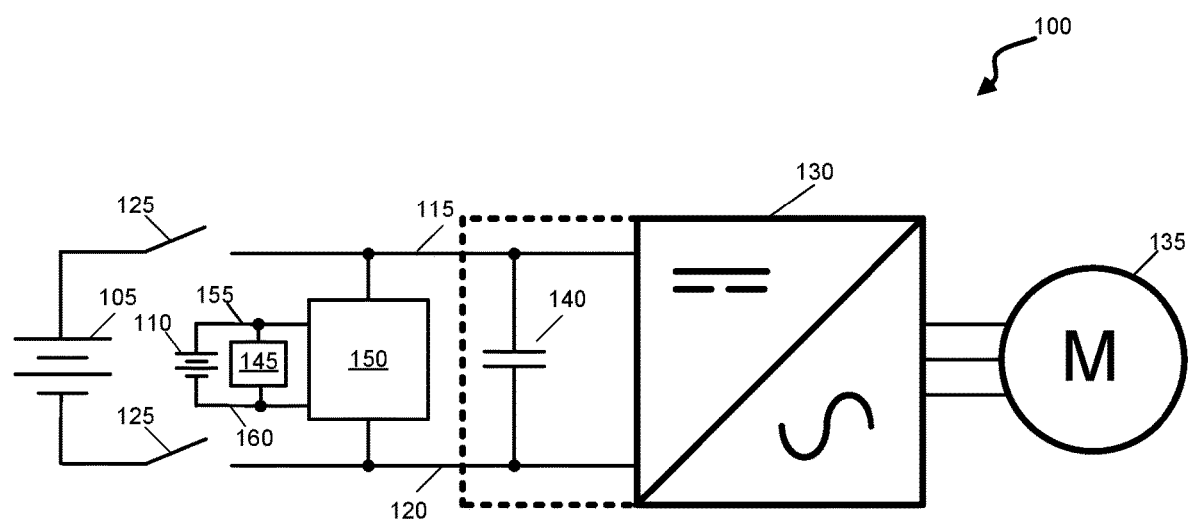
FIG. 1 is a schematic representation of portions of the electrical and drive system of an electric vehicle.

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As discussed above, regulatory agencies often require that the charge retained on a DC link capacitor after disconnection from the high-voltage battery be dissipated reasonably soon after shut down.

In implementations of the present disclosure, a power converter that converts the high voltage across a DC link capacitor to a lower voltage participates in the discharge of the DC link capacitor. Although such power converters can play a variety of different roles in an electric vehicle, a common role is a backup power supply for low-voltage components of the vehicle.

In more detail, many electric vehicles have two or more voltage domains. The first is the high voltage/high power domain of the electric drive system, i.e., the circuitry that provides power for driving the electric motor. For example, the DC link capacitors and inverters discussed above operate in this domain and generally are able to operate with voltages up to several hundred volts. Other voltage domains are lower voltage/lower power and may provide power for vehicle components such as on-board electronics and sensors, head- and tail-lights, the dashboard, and others. In general, different voltage domains are supplied by different batteries. For example, the battery for the electric drive system may have a nominal voltage of several hundred volts (e.g., between 200 and 1200 Volts), whereas the battery for a lower voltage domain may have a nominal voltage of between 5 and 50 volts. For example, the battery for a lower voltage domain may be a 12.6 volt automotive battery.

For various reasons, the different voltage domains are generally separated from one another. One exception to this separation are power converters that convert voltages in the high voltage/high power domain into lower voltages. A common example is a backup power supply (or, alternatively, an emergency power supply) for the low-voltage components. In particular, in the event that the battery for the lower voltage domain fails or discharges, a backup power supply can provide power drawn from the drive system battery to the low voltage domain and help ensure continued safe operation of the vehicle.

Since such power converters draw power from the high voltage drive system battery, they can participate in active discharge of high voltages across the DC link capacitor. Further, since the output voltages of such power converters are necessarily lower than the voltages in the high voltage domain, components (e.g., bleeder resistors) that are rated for lower voltages can be used for the active discharge. Also, in many cases, the signals that trigger active discharge (e.g., a signal to shut down the vehicle) generally originate in a low voltage domain. By conducting the active discharge in a low voltage domain, those signals need not be conveyed to the high voltage/high power domain.

FIG. 1 is a schematic representation of portions of the electrical and drive system 100 of an electric vehicle. Electrical and drive system 100 includes a high voltage domain that is powered by a primary battery 105 and a low voltage domain that is generally powered by a low voltage battery 110. The electric drive system is in the high voltage domain and includes primary battery 105 reversibly coupled and decoupled between a high rail 115 and a low rail 120 by a switch 125. The electric drive system also includes an inverter 130 and an electric motor 135. In operation, under the direction of control electronics, inverter 130 converts the dc voltage supplied by battery 105 into an ac voltage and supplies electric motor 135 with power. A DC link capacitor 140 is coupled between rails 115, 120. However, it should be appreciated that the DC link capacitor 140 may be included in the inverter 130, as illustrated by the thick dashed lines.

Other components 145 of the vehicle are in the low voltage domain. Examples of components 145 can include on-board electronics and sensors, head- and tail-lights, the dashboard, and/or other components. In general, components 145 are powered by battery 110 coupled between rails 155, 160. In some implementations, battery 110 is a 12.6 V automotive battery. In general, rails 115, 120 in the high voltage domain are isolated from rails 155, 160 in the low voltage domain. However, in some vehicle types, it may be possible for rail 160 to be coupled to rail 120 and for batteries 105, 110 to share a common return.

A step-down power converter 150 interfaces between the high voltage domain and the low voltage domain in that it is configured to convert the high voltage across rails 115, 120 into a lower voltage across rails 155, 160. For example, in some implementations, step-down power converter 150 may convert 200 to 1200 volts in the high voltage domain to an output voltage of between 5 and 50 volts in the low voltage domain. In general, but not necessarily, power converter 150 does not convert power continuously during operation of the vehicle. Rather, power converter 150 operates as a backup or emergency power supply and only converts power in selected circumstances, e.g., in the event that battery 110 fails or discharges. Power converter 150 can be implemented in a number of different ways using any of a number of different power converter topologies. For example, power converter 150 can be implemented as an isolated flyback converter.

As discussed further below, power converter 150 also participates in the discharge of the DC link capacitor when battery 105 is decoupled from rails 115, 120 by switch 125.

Switches 125 are either mechanical or solid state switches and coupled to connect and disconnect battery 105 from rails 115, 120. Under normal conditions, battery 105 will be connected to rails 115, 120 when the vehicle that includes electrical and drive system 100 is in operation, e.g., moving or ready to move. Battery 105 will be disconnected from rails 115, 120 during shut-off or in the event of a sufficiently severe fault condition.

Upon connection of battery 105 to rails 115, 120, both DC link capacitor 140 and inverter 130 will be biased by battery 105. The voltage developed across DC link capacitor 140 will tend towards equality with the voltage provided by battery 105. However, deviations from equality will occur since DC link capacitor 140 accepts and provides charge more quickly than battery 105. In addition, the DC link capacitor 140 is generally placed physically closer to the power switches of inverter 130 and some distance from the battery 105. The cable inductance could lead to transient voltage events. DC link capacitor 140 thus acts to smooth the voltage between rails 115, 120 across inverter 130.

Inverter 130 can include a collection of phase legs that are each formed by a pair of switching devices coupled in series between rails 115, 120. In general, the switching devices will be insulated-gate bipolar transistors (IGBT) or other power semiconductor devices. Other power semiconductor switches could include gallium nitride (GaN), silicon (Si), or silicon carbide (SiC) based transistors. Further, metal-oxide field-effect transistors (MOSFET) or bipolar junction transistors (BJT) may also be used.

The switching of the switching devices in inverter 130 is driven by gate driver circuitry under the control of a controller. The gate driver circuitry is in the high voltage domain and referenced to rail 120, but the controller can be in either or both of the high voltage and low voltage domains.

Figure 2:
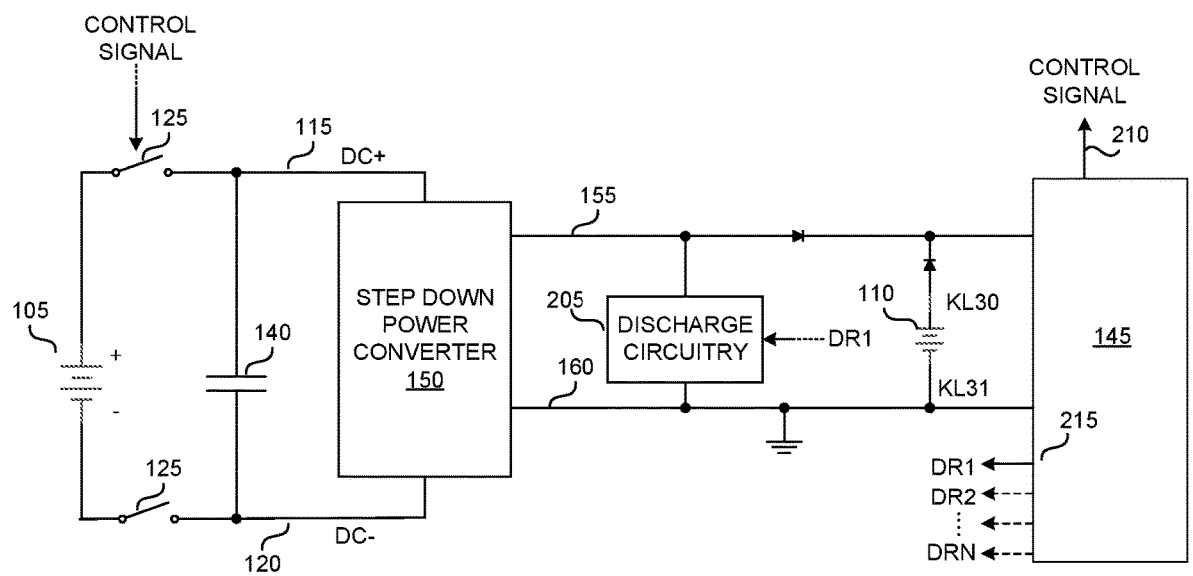
FIG. 2 is a schematic representation of components that participate in the discharge of a DC link capacitor.

FIG. 2 is a schematic representation of components that participate in the discharge of the DC link capacitor 140 when battery 105 is decoupled from rails 115, 120 by switch 125. In addition to components that have already been described, discharge circuitry 205 is also illustrated. Further, low voltage domain components 145 include a control signal output 210 and a discharge drive signal output 215.

Discharge circuitry 205 is coupled between rails 155, 160 in the low voltage domain. In the illustrated implementation, rails 155, 160 are coupled to terminals KL30, KL31 under the DIN 72552 standard, with the positive terminal of battery 110 protected from reverse biasing by a decoupling diode. As discussed further below, discharge circuitry 205 can be implemented in a variety of different ways. Regardless of the particular implementation, when driven by a discharge drive signal DR1, discharge circuitry 205 acts as a load on the output of step-down power converter 150. In other words, the discharge circuit 205 is coupled to the output of the step-down power converter 150. During this time, step-down power converter 150 draws power from the high voltage domain to supply discharge circuitry 205—and discharge DC link capacitor 140.

In particular, in operation, a control signal triggers switch 125 to disconnect primary battery 105 from high voltage supply rails 115, 120. The control signal itself can be triggered, e.g., by shut down of the vehicle or a sufficiently severe fault condition. In general, the control signal will originate from components 145 in the low voltage domain and output over a control signal output 210. For example, the control signal can originate from, e.g., user control/interface components and/or safety components in the low voltage domain. If needed, the control signal can be stepped up or transferred across a galvanic isolation barrier to trigger the driving of switch 125 to disconnect primary battery 105 from high voltage supply rails 115, 120.

Components 145 can also output one or more discharge drive signals DR1, DR2, . . . over one or more discharge drive signal outputs 215. It should be appreciated that the additional discharge drive signals DR2 . . . DRN are optional and shown in dashed lines. The discharge drive signals DR1, DR2, DRN trigger discharge circuitry 205 to load the output of step-down power converter 150 and thereby draw power from the high voltage domain. In general, discharge drive signals DR1, DR2, . . . trigger discharge circuitry 205 after the control signal triggers switch 125 to disconnect primary battery 105 from high voltage supply rails 115, 120. For example, discharge circuitry 205 can be triggered some microseconds to milliseconds after switch 125 is opened. However, in some applications, discharge circuitry 205 can be triggered seconds after switch 125 is opened. In some implementations, the control signal that opens switch 125 and one or more of discharge drive signals DR1, DR2, DRN are the same signal and output over a single terminal.

In response to discharge drive signals DR1, DR2, DRN, discharge circuitry 205 loads the output of step-down power converter 150. Step-down power converter 150 draws power that was stored on DC link capacitor 140 (and possibly elsewhere in the high voltage domain) to supply discharge circuitry 205. By drawing power from DC link capacitor 140, step-down power converter 150 discharges DC link capacitor 140, e.g., to levels sufficient to meet regulatory requirements.

As discussed above, discharge drive signals DR1, DR2, DRN generally trigger discharge circuitry 205 after the control signal triggers switch 125 to disconnect primary battery 105 from high voltage supply rails 115, 120. However, even if by happenstance discharge drive signals DR1, DR2, DRN were to trigger discharge circuitry 205 while primary battery 105 is still inadvertantly connected to high voltage supply rails 115, 120, this failure would not cascade. In more detail, step-down power converter 150 inherently limits the power that is supplied to discharge circuitry 205 and other components in the low voltage domain. Even if primary battery 105 remains connected to high voltage supply rails 115, 120 while discharge circuitry 205 attempts to discharge, step-down power converter 150 will limit the power provided to the low voltage domain and reduce the chance that discharge circuitry 205 and other elements are damaged.

Figure 3:
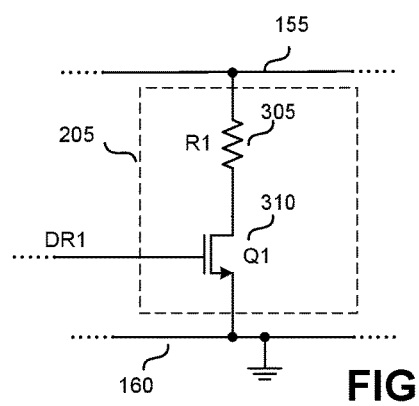
FIGS. 3-5 are schematic representations of different implementations of discharge circuitry.

FIG. 3 is a schematic representation of one implementation of discharge circuitry 205. The illustrated implementation of discharge circuitry 205 includes a resistance 305 and switch 310 coupled in series between rails 155, 160. The control terminal of switch 310 is coupled to be driven by a single discharge drive signal DR1. In the illustrated implementation of discharge circuitry 205, switch 310 is shown as an NMOS transistor.

Other implementations using other transistor devices are possible—both for this implementation of discharge circuitry 205 and for the other implementations discussed below. In any case, the resistance of switch 310 in the on state is much smaller than the magnitude of the associated resistance 305.

In operation, discharge drive signal DR1 drives switch 310 into conduction and current is conducted through resistance 305. In many implementations, discharge drive signal DR1 drives switch 310 intermittently. For example, discharge drive signal DR1 can be a pulse train that drives switch 310 into and out of conduction repeatedly, thereby avoiding excessive resistive heating of resistance 305. Alternatively, resistance 305 can be configured to withstand continuous resistive heating. In any case, discharge circuitry 205 loads step-down power converter 150 and dissipates power according to the magnitude of the voltage difference between rails 155, 160 and the magnitude of the current flow through resistance 305 and switch 310.

Figure 4:
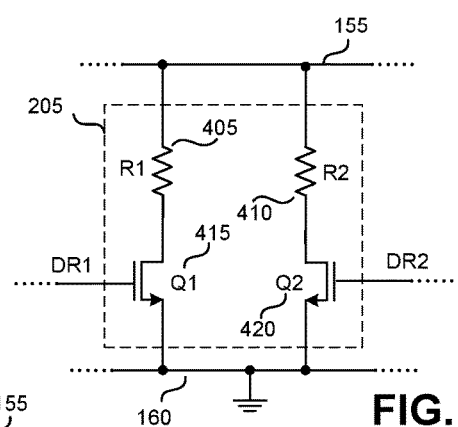

FIG. 4 is a schematic representation of another implementation of discharge circuitry 205. The illustrated implementation of discharge circuitry 205 includes resistances 405, 410 and switches 415, 420. Resistance 405 and switch 415 are connected in series to form a first conduction path between rails 155, 160. Resistance 410 and switch 420 are connected in series to form a second conduction path between rails 155, 160. The control terminal of switch 415 is coupled to be driven by a first discharge drive signal DR1. The control terminal of switch 420 is coupled to be driven by a second discharge drive signal DR2. The resistance of each switch 415, 420 when in the on state is much smaller than the magnitude of the associated resistance 405, 410.

In operation, discharge drive signals DR1, DR2 drive switches 415, 420 into conduction and current is conducted through discharge circuitry 205—either continuously or intermittently. Further, switches 415, 420 can be driven at the same time so that they conduct simultaneously or at different times so that they conduct alternatively. Hybrid driving schemes—in which switches 415, 420 are driven at times to conduct simultaneously and at times alternatively—are also possible.

When switches 415, 420 are driven to conduct simultaneously, the net current through discharge circuitry 205 is higher, step-down power converter 150 will draw more power from DC link capacitor 140, and DC link capacitor 140 will be discharged relatively more quickly. When switches 415, 420 are driven to conduct alternatively, power will be drawn from DC link capacitor 140 more slowly. However, resistive heating of resistances 405, 410 can be reduced. For example, assume that resistance 405 conducts for a first duration before switch 415 is switched out of conduction. Without current flow through switch 415 and resistance 405, resistance 405 can cool—even while current is conducted by switch 420 and resistance 410. Corresponding cooling of resistance 410 can be achieved by switching switch 420 out of conduction. In another example, both switches 415, 420 are driven to conduct simultaneously and the value of the resistances 405, 410 can be reduced as compared to resistance 305 of FIG. 3. For example, if both switches 415, 420 are driven to conduct simultaneously, the value of resistances 405, 410 can be substantially 50% of the value of resistance 305 of FIG. 3 to conduct the equivalent power of the example discharge circuit shown in FIG. 3.

Furthermore, the shown implementation provides a redundancy for conduction/discharge path in case one path (combination of 405/415 or 410/420) fails.

Regardless of the particular driving scheme, discharge circuitry 205 loads step-down power converter 150. The instantaneous power dissipation by discharge circuitry 205 is related to the magnitude of the voltage difference between rails 155, 160 and the instantaneous magnitude of the current(s) through resistances 405, 410 and switches 415, 420.

Figure 5:
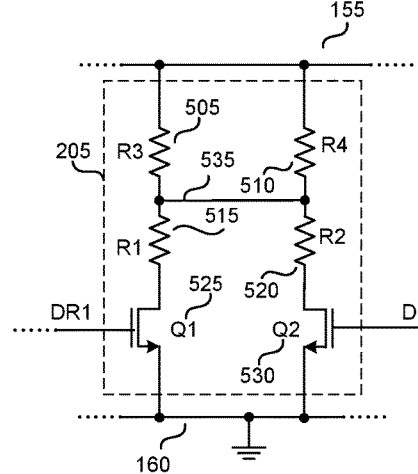

FIG. 5 is a schematic representation of another implementation of discharge circuitry 205. The illustrated implementation of discharge circuitry 205 includes resistances 505, 510, 515, 520, switches 525, 530, and a bridge node 535. Resistances 505, 510 are both coupled between rail 155 and bridge node 535. Resistance 515 and switch 525 are coupled to form a first conduction path between bridge node 535 and rail 160. Resistance 520 and switch 530 are coupled to form a second conduction path between bridge node 535 and rail 160. The control terminal of switch 525 is coupled to be driven by a first discharge drive signal DR1. The control terminal of switch 530 is coupled to be driven by a second discharge drive signal DR2. The resistance of each switch 525, 530 in the on state is much smaller than the magnitude of each of resistances 505, 510, 515, 520.

In operation, discharge drive signals DR1, DR2 drive switches 525, 530 into conduction and current is conducted through discharge circuitry 205—either continuously or intermittently. Further, switches 525, 530 can be driven at the same time so that they conduct simultaneously or at different times so that they conduct alternatively. Hybrid driving schemes—in which switches 525, 530 are driven at times to conduct simultaneously and at times alternatively—are also possible.

When switches 525, 530 are driven to conduct simultaneously, current will flow through resistances 505, 510, 515, 520 in accordance with the ratios of their respective resistances. However, when only one of switches 525, 530 is driven to conduct, current will continue to flow through both resistances 505, 510 but exclusively through the respective one of resistances 515, 520. Once again, a respective one of resistances 515, 520 can be provided with time to cool if needed. For example, both switches 525, 530 are driven to conduct simultaneously and the value of the resistances 505, 510, 515, 520 can be reduced as compared to resistance 305 of FIG. 3. For example, if both switches 525, 530 are driven to conduct simultaneously, the value of resistances 505, 510, 515, 520 can be substantially 25% of the value of resistance 305 of FIG. 3 to conduct the equivalent power of the example discharge circuit shown in FIG. 3.

Furthermore, the shown implementation increases the level of redundancy compared to FIG. 3 and FIG. 4 and provides alternative discharge paths in case up to two resistors or one switch fails.

Regardless of the particular driving scheme, discharge circuitry 205 loads step-down power converter 150. The instantaneous power dissipation by discharge circuitry 205 is related to the magnitude of the voltage difference between rails 155, 160 and the instantaneous magnitude of the current(s) through resistances 505, 510, 515, 520 and switches 525, 530.

Further, by appropriate selection of the components and their arrangement in the conduction path(s), some implementations of discharge circuitry 205 may be configured to remain operational and conduct current even when battery 105 is not disconnected from the DC link capacitor 140 by switch 125. This may be beneficial in inadvertent circumstances, for example, if switch 125 were to malfunction. Even if such configurations of discharge circuitry 205 were to remain coupled to battery 105, discharge circuitry 205 would not be overloaded by the constant power provided by step-down converter 150. With the connection to battery 105 remaining, DC link capacitor 140 may not discharge. However, neither the step-down converter 150 nor discharge circuitry 205 need be damaged or destroyed.

Other implementations of discharge circuitry 205 are also possible. For example, each of the implementations shown in FIGS. 3-5 can be used in a series or parallel combination with the other. Various other resistive network and switching configurations can also be used.

Figure 6:
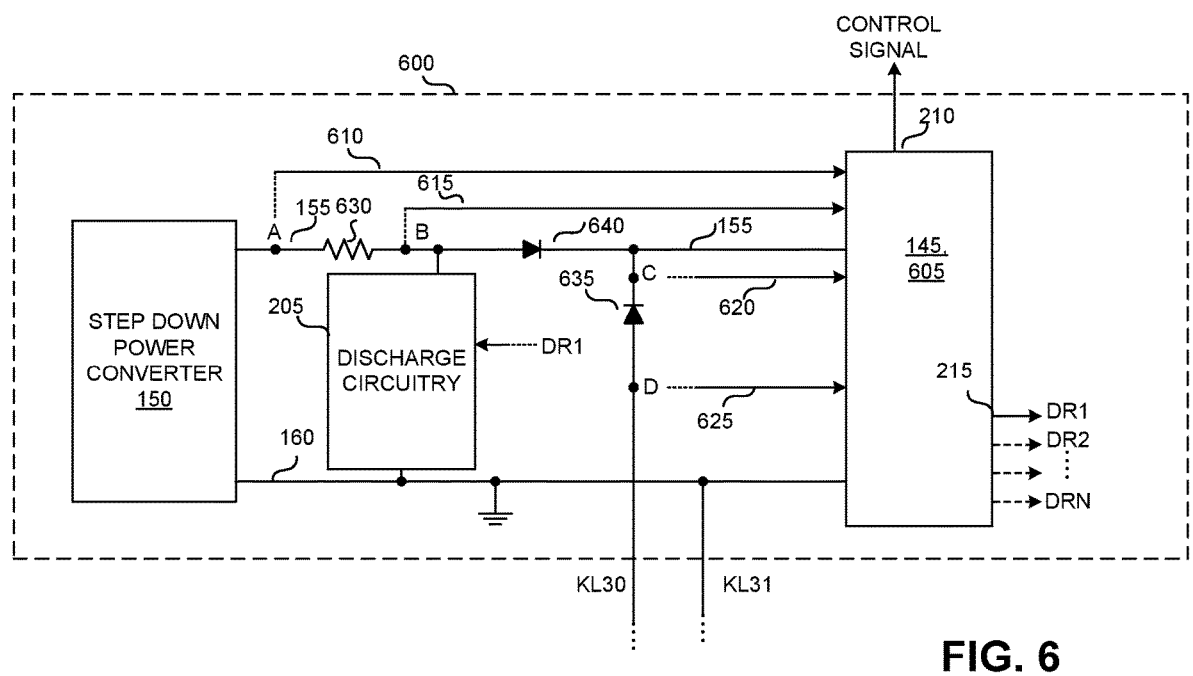
FIG. 6 is a schematic representation of components that participate in the discharge of a DC link capacitor.

FIG. 6 is a schematic representation of components that participate in the discharge of the DC link capacitor 140 when battery 105 is decoupled from rails 115, 120 by switch 125, namely, the components of a control board 600. In addition to discharging DC link capacitor 140, the components of control board 600 can also diagnose the functionality of step-down power converter 150, e.g., to ensure that step-down power converter 150 is available to discharge DC link capacitor 140.

In more detail, control board 600 includes various control board electronics 605 that are in the low voltage domain. Control board electronics 605 can be a subset of components 145. One or more sense lines 610, 615, 620, 625 can be coupled between control board electronics 605 and various nodes on control board 600. In various combinations, different sense lines 610, 615, 620, 625 can provide indications about the supply of power to control board electronics 605 and proper functioning of step-down power converter 150.

For example, sense lines 610, 615 are coupled to nodes A, B, i.e., across a sense resistance 630 on rail 155 at the output of step-down power converter 150. Sense line 610 provides information regarding the sensed voltage at node A to the control board electronics 605. Sense line 615 provides information regarding the sensed voltage at node B to the control board electronics 605. Current flow along rail 155 can be measured according to a voltage difference between sense lines 610, 615 and indicate whether step-down power converter 150 is providing power to control board 600.

As another example, sense lines 620, 625 are coupled to nodes C, D, i.e., across a decoupling diode 635 that protects a battery (e.g., battery 110) that supplies control board electronics 605 during normal operations. Sense line 620 provides information regarding the sensed voltage at node C to the control board electronics 605. Sense line 625 provides information regarding the sensed voltage at node D to the control board electronics 605. A comparison of the voltage on either of sense lines 620, 625 with the voltage on sense line 615 indicates whether control board electronics 605 are supplied by battery 110 or by step-down power converter 150.

As yet another example, the voltage on either or both of sense lines 610, 615 can be used to identify a malfunction in step-down power converter 150. For example, at a time when battery 110 supplies control board electronics 605, if the voltage on either sense line 610, 615 drops below a threshold level, step-down power converter 150 can be identified as malfunctioning. As yet another example, at a time when step-down power converter 150 supplies control board electronics 605, if the voltage on sense line 615 drops below a threshold level, this too can used to identify that step-down power converter 150 is malfunctioning, i.e., to identify that step-down power converter 150 is incapable of supplying control board electronics 605 with sufficient current.

In operation, discharge circuitry 205 can be used to confirm proper functioning of step-down power converter 150, e.g., during system checks at vehicle start-up or even periodically during operation of the vehicle. As discussed above, discharge circuitry 205 acts as a load across the output of step-down power converter 150 when driven into conduction by one or more discharge drive signals DR1, DR2, . . . Loading step-down power converter 150 with discharge circuitry 205 will generate a voltage difference between sense lines 610, 615. With the known load provided by discharge circuitry 205 and the voltage difference across sense resistance 630, discharge circuitry 205 can be used to determine whether step-down power converter 150 is capable of supplying sufficient power to control board electronics 605 in the event of battery 110 failing. Further, since rail 155 includes a decoupling diode 640 that decouples discharge circuitry 205 from control board electronics 605, the functioning of step-down power converter 150 can be confirmed even when control board electronics 605 are supplied by battery 110. In particular, the voltage on the anode side of diode 640 (i.e., the voltage sensed by line 615) can vary without impairing the supply of power to control board electronics 605 so long as the voltage on the anode side of diode 640 does not rise approximately one diode drop above the voltage sensed by line 620.

Figure 7:
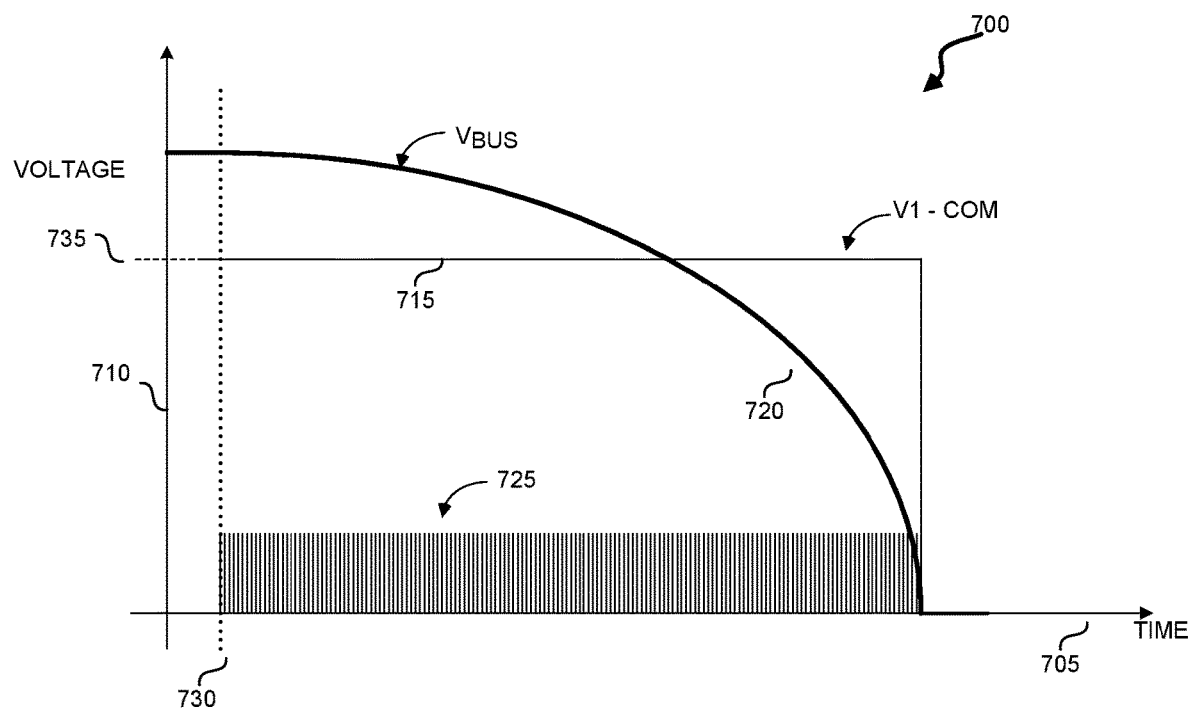
FIG. 7 is a graphical representation of the time course of various voltage signals during discharge of a DC link capacitor.

FIG. 7 is a graphical representation 700 of the time course of various voltage signals during discharge of a DC link capacitor, e.g., DC link capacitor 140. Representation 700 includes an x-axis 705, a y-axis 710, and three traces 715, 720, 725. Position along x-axis 705 indicates time and is scaled uniformly for all three traces 715, 720, 725. The illustrated duration of x-axis 705 between switching start and end of the signal 725 is in the range of the intended discharge time, as discussed previously. Position along y-axis 705 indicates voltage and is scaled differently for the different traces 715, 720, 725.

Trace 715 represents the output voltage of step-down power converter 150, i.e., the voltage across rails 155, 160 in the vicinity step-down power converter 150 (e.g., on the anode side of diode 640).

Trace 720 represents the voltage across a DC link capacitor, e.g., DC link capacitor 140.

Trace 725 represents an example discharge drive signal DR1. As shown, trace 725 is a relatively high frequency pulse train and drives the receiving discharge circuity 205 into and out of conduction. Discharge circuity 205 thus alternates between loading step-down power converter 150 and dissipating resistive heating.

In the illustrated implementation, step-down power converter 150 switches from stand-by mode into operation at a time 730 in response to the pulses in the discharge drive signal DR1 shown trace 725. Time 730 can be, e.g., the time when a shut down or fault signal is received by board electronics 605 or other components 145. The output voltage of step-down power converter 150—as represented by trace 715—remains at a regulated output level 735. Step-down power converter 150 draws power from the high voltage domain to maintain output level 735 even when discharge circuity 205 is loading its output.

Initially, the voltage across a DC link capacitor (as represented by trace 720) will decrease generally exponentially with time at a constant draw of power by discharge circuity 205. However, the voltage across a DC link capacitor will eventually approach the regulated output level 735 of step-down power converter 150. Eventually, the voltage across DC link capacitor 140 will drop too far for step-down power converter 150 to maintain output level 735. In any case, the voltage across DC link capacitor 140 can be reduced to an acceptably safe level. The specific voltage of the safe level will generally depend on the operational context. For example, in some contexts, the voltage across DC link capacitor 140 will be reduced below 60 volts, whereas in other contexts, the voltage across DC link capacitor 140 will be reduced below 30 volts.

In the illustrated implementation, at this time, the discharge drive signal DR1 represented by trace 725 stops driving discharge circuity 205 and discharge through step-down power converter 150 ends. The voltage across DC link capacitor 140 will continue to decrease—albeit at a slower rate—due to parasitic and other power consumption in the high voltage domain.

In other implementations, the discharge drive signal DR1 represented by trace 725 can either stop driving discharge circuity 205 sooner (i.e., before the voltage across DC link capacitor 140 becomes so low that step-down power converter 150 cannot regulate its output to output level 735) or later (i.e., after step-down power converter 150 cannot regulate its output to output level 735).

In some implementations, the discharge drive signal DR1 represented by trace 725 is not a continuous pulse train but a constant ON signal or rather, e.g., a PWM or frequency-modulated signal that varies with the voltage across DC link capacitor 140.

A number of implementations have been described. Nevertheless, it will be understood that various modifications may be made. Accordingly, other implementations are within the scope of the following claims.

What is claimed is:

1. A discharge system for an electric vehicle, the discharge system comprising:
   a step-down power converter configured to step down an input voltage to an output voltage, wherein the input voltage is higher than the output voltage;
   a discharge circuitry coupled to the output of the step-down power converter, wherein the discharge circuitry is reversibly driveable to load the step-down power converter;
   a user interaction component configured to receive an input that originated from a human user, wherein the input indicates that the electric vehicle is to shutdown;
   a discharge drive circuitry configured to drive the discharge circuitry to load the step-down power converter in response to the indication that the electric vehicle is to shutdown, and
   a fault detection circuitry, wherein the discharge drive circuitry is configured to respond to identification of a fault by driving the discharge circuitry to load the step-down power converter.

2. The discharge system of claim 1, wherein the discharge drive circuitry is configured to drive the discharge circuitry to intermittently load the step-down power converter.

3. The discharge system of claim 1, wherein the step-down power converter is a backup power converter, an emergency power converter, or both, that is coupled to supply the user interaction component with power in an event of a failure of a battery to supply the user interaction component with power.

4. The discharge system of claim 1, wherein the step-down power converter is configured to step down an input voltage between 200 to 1200 volts to an output voltage between 5 and 50 volts.

5. The discharge system of claim 1, wherein the discharge circuitry comprises a first resistance coupled with a first switch across the output of the step-down power converter.

6. The discharge system of claim 5, wherein the discharge circuitry further comprises a second resistance coupled to a second switch across the output of the step-down power converter.

7. The discharge system of claim 6, wherein the first switch and the second switch are driven simultaneously.

8. The discharge system of claim 6, wherein the first switch and the second switch are driven alternately.

9. The discharge system of claim 6, wherein the discharge circuitry further comprises a third resistance coupled to the first resistance at a bridge node, and a fourth resistance coupled to the second resistance at the bridge node.

10. An electric vehicle comprising:
    an electric motor reversibly coupleable and decoupleable to receive power from a positive supply rail and a negative supply rail;
    a supply capacitor coupled between the positive supply rail and the negative supply rail;
    a step-down power converter coupled to draw power from the supply capacitor, wherein the step-down power converter is configured to step down a voltage across the supply capacitor and output a voltage on an output, wherein the voltage on the output is lower than the voltage across the supply capacitor; and
    discharge circuitry coupled to the output of the step-down power converter, wherein the discharge circuitry is reversibly driveable to load the step-down power converter, the discharge circuitry further comprising:

a first resistance coupled with a first switch across the output of the step-down power converter;

a second resistance coupled to a second switch across the output of the step-down power converter;

a third resistance coupled to the first resistance at a bridge node, and a fourth resistance coupled to the second resistance at the bridge node.

11. The electric vehicle of claim 10, further comprising a switch disposed to reversibly couple and decouple the electric motor coupled to receive power from a positive supply rail, wherein the switch is controlled by a control signal output from circuitry coupled to be supplied with power by the step-down power converter.

12. The electric vehicle of claim 10, further comprising:

a primary battery having an output power sufficient to drive the electric motor; and a second battery having an output voltage comparable to an output voltage of the step-down power converter.

13. The electric vehicle of claim 12, wherein:

the step-down power converter is configured to step down an input voltage of between 200 to 1200 volts to an output voltage of between 5 and 50 volts;

the primary battery is configured to output a voltage of several hundreds of volts; and the second battery is configured to output a voltage of between 5 and 50 volts.

14. The electric vehicle of claim 12, wherein:

the output of the step-down power converter and the output of the second battery are both coupled to voltage supply rails for electrical components of the electric vehicle.

15. The electric vehicle of claim 14, wherein the electrical components of the electric vehicle include one or more of on-board electronics, on-board sensors, headlights, taillights, or a dashboard.

16. A discharge system for an electric vehicle, the discharge system comprising:

a step-down power converter configured to step down an input voltage to an output voltage, wherein the input voltage is higher than the output voltage and the step-down power converter is coupled to output the output voltage across supply rails;

discharge circuitry coupled between the supply rails;

a battery coupled across the supply rails;

electronics coupled to be supplied with power from the supply rails, wherein the electronics include an output terminal coupled to provide a drive discharge signal to the discharge circuitry, wherein the discharge circuitry is reversibly driveable by the drive discharge signal to allow current to flow between the supply rails; and a decoupling diode disposed along a first of the supply rails and between a coupling of the discharge circuitry to the first of the supply rails and a coupling of the battery to the first of the supply rails.

17. The discharge system of claim 16, wherein the output voltage of the step-down power converter is lower than a sum of a nominal voltage of the battery and a diode drop of the decoupling diode.

18. The discharge system of claim 16, further comprising a sense line, wherein the sense line is coupled to the first of the supply rails between the output of the step-down power converter and the decoupling diode.

19. The discharge system of claim 18, wherein the sense line is further coupled to the electronics, wherein the electronics are configured to reversibly drive the discharge circuitry and, based on a voltage sensed over the sense line, determine if the step-down power converter is operational.

20. The discharge system of claim 18, further comprising a second sense line, wherein the second sense line is coupled to an output of the battery.

21. The discharge system of claim 20, wherein the second sense line is further coupled to the electronics, and wherein the electronics are configured to compare a voltage or a current sensed by the second sense line with a voltage or a current sensed by the sense line.

* * * * *